(12) United States Patent
Ware et al.

(10) Patent No.: US 10,199,089 B2
(45) Date of Patent: Feb. 5, 2019

(54) REDUCED TRANSPORT ENERGY IN A MEMORY SYSTEM

(71) Applicant: Rambus Inc., Sunnyvale, CA (US)

(72) Inventors: Frederick A. Ware, Los Altos Hills, CA (US); John Eric Linstadt, Palo Alto, CA (US); Thomas Vogelsang, Mountain View, CA (US)

(73) Assignee: Rambus Inc., Sunnyvale, CA (US)

( * ) Notice: Subject to any disclaimer, the term of this patent is extended or adjusted under 35 U.S.C. 154(b) by 0 days.

(21) Appl. No.: 15/876,539

(22) Filed: Jan. 22, 2018

(65) Prior Publication Data

US 2018/0197596 A1  Jul. 12, 2018

Related U.S. Application Data

(63) Continuation of application No. 15/352,366, filed on Nov. 15, 2016, now Pat. No. 9,875,787.

(60) Provisional application No. 62/399,202, filed on Sep. 23, 2016, provisional application No. 62/264,674, filed on Dec. 8, 2015.

(51) Int. Cl.
*G11C 8/00* (2006.01)
*G11C 11/4093* (2006.01)
*G11C 11/4094* (2006.01)
*G11C 11/4076* (2006.01)
*G11C 11/4097* (2006.01)

(52) U.S. Cl.
CPC ...... *G11C 11/4093* (2013.01); *G11C 11/4076* (2013.01); *G11C 11/4094* (2013.01); *G11C 11/4097* (2013.01)

(58) Field of Classification Search
CPC .. G11C 5/025; G11C 5/02; G11C 7/10; G11C 8/12; G11C 11/4076; G11C 11/4096; G11C 11/4093; G11C 11/4097; G11C 29/022; G11C 7/1006; G11C 7/1072; G11C 11/4094; G11C 2029/0411; G11C 5/063; G11C 7/1066; G11C 8/00; G11C 19/00
USPC ........... 365/230.01, 51, 189.07, 201, 230.03, 365/230.06
See application file for complete search history.

(56) References Cited

U.S. PATENT DOCUMENTS

| | | |
|---|---|---|
| 8,471,362 B2 | 6/2013 | Lee |
| 8,908,454 B2 | 12/2014 | Vogelsang et al. |
| 9,036,065 B1 * | 5/2015 | Vogelsang ............. H04N 5/378 348/308 |
| 9,111,588 B2 | 8/2015 | Vogelsang |
| 2015/0003181 A1 | 1/2015 | Droege et al. |

* cited by examiner

*Primary Examiner* — Thong Q Le
(74) *Attorney, Agent, or Firm* — Lowenstein Sandler LLP

(57) ABSTRACT

A memory stack comprises at least two memory components. The memory components have a first data link interface and are to transmit signals on a data link coupled to the first data link interface at a first voltage level. A buffer component has a second data link interface coupled to the data link. The buffer component is to receive signals on the second data link interface at the first voltage level. A level shifting latch produces a second voltage level in response to receiving the signals at the second data link interface, where the second voltage level is higher than the first voltage level.

20 Claims, 9 Drawing Sheets

REDUCED TRANSPORT ENERGY IN A MEMORY SYSTEM

RELATED APPLICATION

This application is a continuation application of U.S. patent application Ser. No. 15/352,366, filed on Nov. 15, 2016, which claims the benefit of U.S. Provisional Application 62/399,202, filed on Sep. 23, 2016 and U.S. Provisional Application 62/264,674, filed on Dec. 8, 2015, the entire contents of all are hereby incorporated by reference in their entirety.

BACKGROUND

Memory devices, such as dynamic random access memory (DRAM) arrays, store data in memory elements. Accessing the data in memory elements may costs time and power resources. Some applications of memory devices may have power consumption constraints based on the environment of the memory device. Accordingly, memory architectures and operations that provide efficient access of memory elements may be used to limit power consumption for memory devices.

BRIEF DESCRIPTION OF THE DRAWINGS

The subject matter disclosed is illustrated by way of example, and not by way of limitation, in the figures of the accompanying drawings and in which like reference numerals refer to similar elements and in which.

DETAILED DESCRIPTION

Figure 1:
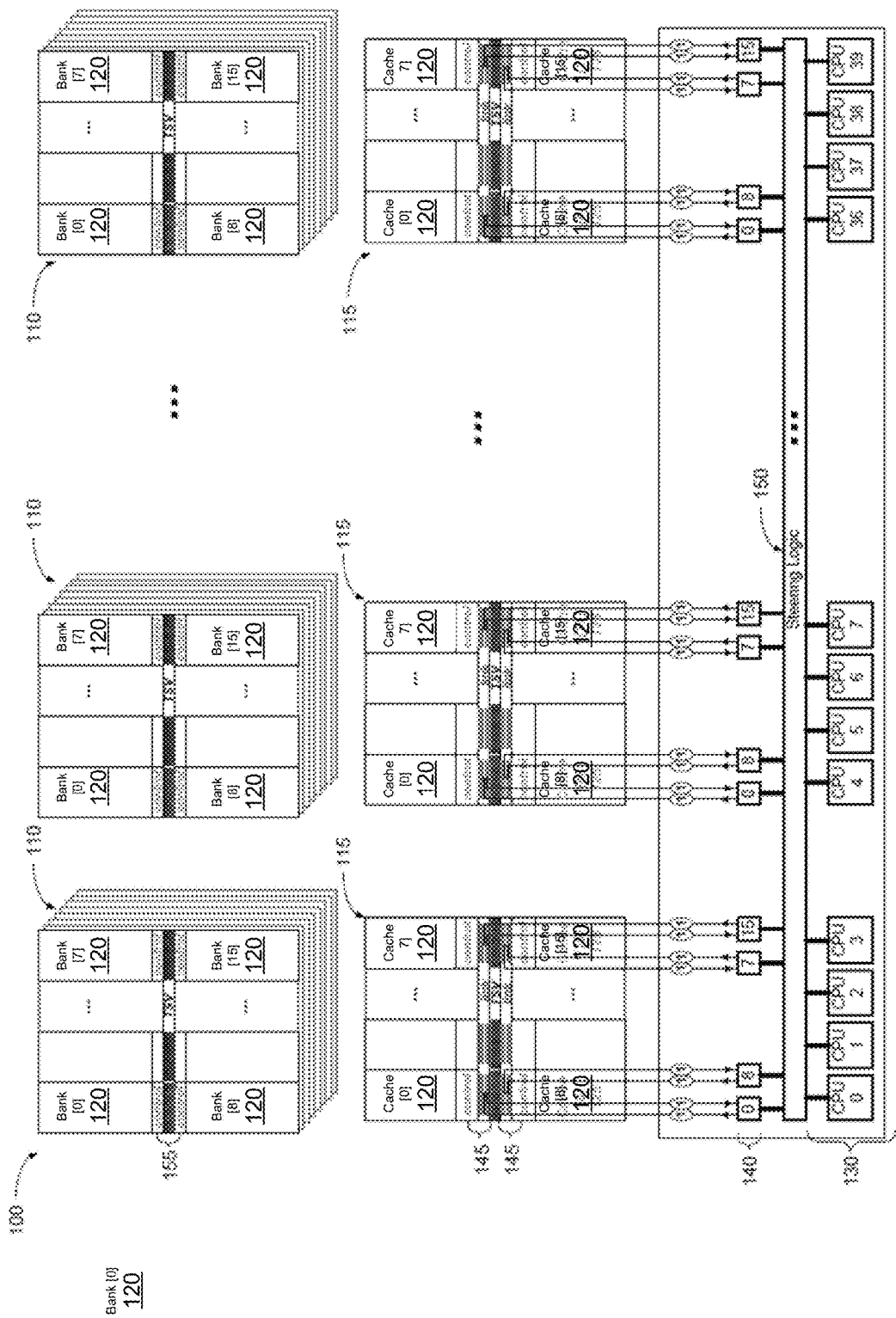
FIG. 1 is a block diagram of a computing system having a plurality of independent memory stacks in communication with a plurality of processors, according to an embodiment.

Efficient operation of memory devices may reduce total power consumption of the memory device and reduce heat generated by the memory device. In addition to operation of memory cells of a memory device, a memory device may consume power and generate heat during the transportation of one or more bits from one component of the memory device to another component of a memory device. For example, in a memory device having a memory stack, the internal transport of data within one layer of the stack, internal transport to a buffer of the memory stack, and internal transport from the memory device may consume power and generate heat.

The amount of energy consumed and heat generated may be approximately equal to the voltage squared times the capacitance for a data link. Therefore, the energy consumed and heat generated to transport a bit over a link may be reduced by reducing the voltage that is used to transport the bit or the capacitance of the data link. Furthermore, reducing the voltage may reduce the overall energy quadratically because the energy consumption is dependent on the square of the voltage. However, a signal representing data may be at a particular voltage level in order to be used by logic in a memory or buffer layer. For example, the signal representing the bit may have a minimum threshold value based on the architecture used to access data stored in memory cells. Accordingly, a signal representing data may have its voltage reduced before transportation over a data link in order to reduce energy consumption across the data link. The signal may then be received at the other end of a data link and have its voltage increased to a voltage level used by circuits at the other end of the link.

In some embodiments, data may be transported with a lower voltage over multiple links in order to provide a bit from a memory device. For example, a bit may be read from a memory cell at a first voltage of approximately 0.5V in some embodiments. The voltage of the signal may then be reduced before transporting the bit over an internal data link to a bank of links that are to transport the bit from the layer of a memory layer. For example, a signal representing a bit may be reduced to approximately 0.1V prior to transportation over an internal data link. After being received by a control circuit of a layer of the memory layer, the voltage of the signal may be increased to be processed by processing logic before being transport away from the memory layer. The voltage of the signal may then be reduced before transporting the signal away from the memory layer. For example, the voltage may be decreased to the same lower level as for the previous internal data link transport before transport over through-silicon-vias (TSVs) to a memory buffer. The signal may then be received at a memory buffer before being transported from the memory stack. The memory buffer may increase the signal for internal processing or temporary storage in a memory cell. The memory buffer may then reduce the voltage again to provide the signal to an internal data link of the memory buffer before providing the signal to a link for transport from the memory device.

In some embodiments, a memory device as described herein may be implemented as a set of memory stacks. Each memory stack may include a number of layers connected through a set of data links. For example, in some embodiments, each memory stack may have eight layers connected by one or more TSV. The layers of a memory stack may include an array of memory elements arranged into rows and columns. For example, the layers of the memory stack may be a dynamic random access memory (DRAM) including individual memory cells capable of storing one or more bits of data.

The memory elements may be accessed by asserting a plurality of wordlines and bitlines coupled to the memory elements. For example, asserting a wordline and bitline corresponding to a particular memory element may present the information from the memory element to a sense amplifier on the memory device. The sense amplifier may then amplify the data from the memory element and output it on a column line. In some embodiments, the sense amplifier may output a signal indicating the information stored in a sensed memory cell at a voltage of 0.5V. The voltage may then be reduced to a lower voltage before transportation to control circuitry of the layer of the memory device. In some embodiments, the lower voltage is provided to the memory device from an external source. The voltage provided for a signal representing the bit to be transport may then be used to control whether the lower voltage signal indicates a high bit or a low bit. For example, if the voltage provided from the sense amplifier is provided as a differential pair, each component of the pair may signal a voltage for transporting the differential pair on the data link.

When receiving the lower voltage signal at the terminating end of a data link, the voltage may be restored to a higher voltage level used by processing components of the memory device. For example, the receiving end may include a circuit, such as a level shifting latch, for amplifying the signal to a threshold level for use by the processing or storage components. The circuit for amplifying the signal may receive the lower voltage signal at a differential pair of transistors. The circuit may also include a cross-coupled latch that takes a lower voltage signal received by the pair of differential transistors and regeneratively amplifies it to a higher voltage swing. Then, the amplified signal may be held at a holding latch after and provided to a circuit that operates at the higher voltage level.

The circuits for reducing voltage of a signal prior to transport on a data link and increasing the voltage of the signal upon receiving the signal over the data link may be used for transportation over each data link in a memory device. For example, the circuits may be used to reduce voltage to transport a bit to TSVs from memory cells, across TSVs to a memory buffer, and over a data link away from the memory device.

In some embodiments, reducing transport energy may be used in applications that have lower power consumption requirements. For example, a cryogenic computer may use reduced power consumption to maintain lower temperature operation. In some embodiments, a cryogenic computer may operate processors in a temperature range of approximately 4 Kelvin. The processors may use associated memory device that operate at a temperature range of approximately 77 Kelvin. At these low temperatures, each unit of power generated by a system may require 10 times that power to remove the generated heat and maintain the low temperature. Thus, reducing the power consumed and heat generated to transport data bits may significantly impact the overall power consumption for a system. In some embodiments, other cryogenic computers may operate at other temperatures. For example, a cryogenic memory may operate at less than 80 Kelvin, between 0-10 Kelvin, between 10-100 Kelvin, or at other temperatures that enable a cryogenic processor to operate at a desired temperature.

In the following description, numerous specific details are set forth, such as examples of specific types of processors and system configurations, specific hardware structures, specific architectural details, specific system components, specific measurements, operations, etc. in order to provide a thorough understanding of the present implementations. It will be apparent, however, to one skilled in the art that these specific details need not be employed to practice the various implementations. In other instances, well known components or methods, such as specific and alternative processor architectures, specific logic circuits/code for described algorithms, specific firmware code, specific interconnect operation, specific logic configurations, specific manufacturing techniques and materials, specific compiler implementations, specific expression of algorithms in code, specific power down and gating techniques/logic and other specific operational details of memory systems may not be described in detail in order to avoid unnecessarily obscuring the described implementations. The following implementations are generally described with reference to components in DRAM memory devices, however, various implementations may be applicable to other types of memory devices as well. In addition, in some embodiments, the reduced voltage swing for transport of bits over a data link may be used in processors or other components than a memory device.

FIG. 1 depicts a block diagram of a computing system 100 in accordance with an embodiment. The computing system 100 may include a set of memory stacks including data layers 110 and a buffer layer 115. The buffer layer 115 of the memory stacks may communicate with a plurality of central processing units 130 through corresponding links 145, interfaces 140, and steering logic 150.

In some embodiments, the computing system may operate at different temperature domains. The first temperature domain may be used by the CPUs 130, interfaces 140, and steering logic 150, for instance. A second, higher temperature domain may be used by the buffers 115 and memory stacks 110. In some embodiments, the lower temperature domain may operate at approximately 4 Kelvin and the higher temperature domain may operate at approximately 77 Kelvin. In some embodiments, the computing system 100 may have components operating at other temperature ranges.

The CPUs 130 may read to and write from memory banks 120 of memory stacks 110. For example, the CPUs 130 may send a command to a memory stack 110 to write a particular value to a particular address of a memory bank 120. The CPUs 130 may also send a command to read a value from a particular address of a memory bank 120.

The transport of data from the memory bank 120 to the CPU 130 after a read command may pass through several stages of processing logic and several data links. For example, the data may be read at a sense amplifier and provided to a column line in a memory bank. The data from the column line may then be passed across the memory bank 120 by an internal data link to TSVs 155. After processing by the memory bank, the data may be transport through on of TSVs 155 to a memory cache 125 of a buffer 115. The buffer may then transport the data across the buffer 115 by an internal data link to a CPU link 145 for transporting the data to interfaces 140.

To perform a write operation, the computing system 100 may provide the data to a memory cell of a memory bank 120 over the same data links. For example, the data may be provided from a CPU 130 through steering logic 150 and interfaces 140 to a buffer 115. The buffer may then pass the data to a layer of a memory stack 110. The layer of the memory stack 110 may then provide the write data to a memory bank 120 to write the data.

The transport of data or commands over links throughout the computing system 100 may performed at a lower voltage swing level than the level at which processing logic or memory cells operate in the memory banks 120, memory cache 125, or other components of the computing system 100. This may include data transport over links within the buffer 115, within a layer of a memory stack 110, or other links within the computing system 100. The data links may be operated at the lower voltage for both read and write operations of the memory banks 120.

The computing system 100 may operate at a reduced voltage swing for transport of bits along one or more data links. For example, a data link that transports data bits from a memory bank 120 to TSVs 155 of a memory stack may be operated at a reduced voltage swing compared to the voltage swing used by internal logic and memory cells of the memory bank 120. In addition, transport of a data bit through the TSVs 155 to the buffer 115 for a stack may be operated at the reduced voltage swing. The memory cache 125 for a memory stack may also provide the data signals from the TSVs 155 to links 145 for transport from the buffer 115.

Figure 2:
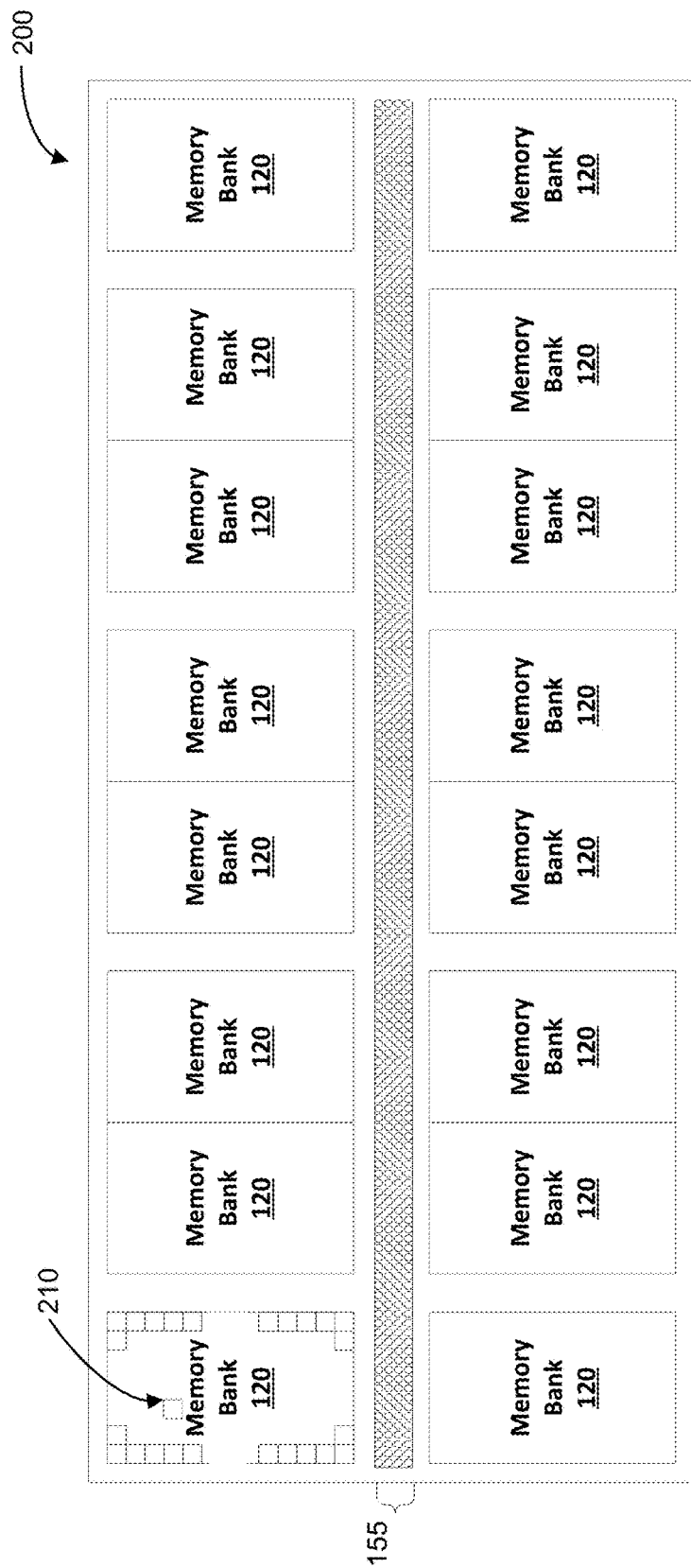
FIG. 2 is a block diagram of a memory component having a plurality of independent memory banks, according to an embodiment

FIG. 2 depicts a block diagram of DRAM layer 200 of a memory stack in accordance with an embodiment that provides a reduced voltage swing for one or more data transport links. For instance, the reduced voltage swing may be used to transport data from a memory bank 120 to TSVs 155. The memory device 100 may include an array of memory elements organized into individual memory banks 120. The example memory device 100 shown in FIG. 2 has 16 independent memory banks 120. In some embodiments, the memory device 100 may have fewer or additional memory banks 120.

Each memory bank 120 may include a plurality of sub-arrays 210. The sub-arrays 210 may each include a plurality of memory elements. As an example, each sub-array 210 may have 512 sub-rows each having 576 memory elements. In some embodiments, the sub-arrays may have fewer or additional sub-rows. Furthermore, each sub-row may have fewer or additional memory elements. Each memory bank 120 may have independent address logic and local drivers to perform memory operations. For instance, each memory bank 120 may have column and row selection logic to select one or more memory elements for a particular memory operation. In some embodiments, a DRAM layer 200 of a memory stack may include a single memory bank 120 or a memory bank 120 may include a single array that is not organized into sub-arrays 210.

Figure 3:
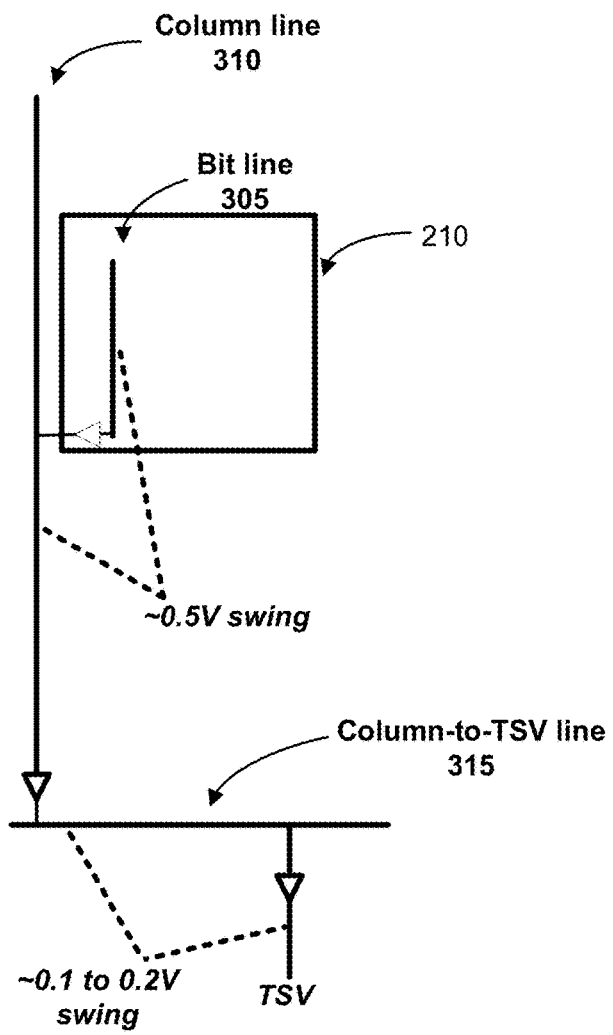
FIG. 3 is a block diagram depicting a memory sub-array and associated data links, according to an embodiment.

A CPU, such as CPUs 130 in FIG. 1, may access one or more memory banks 120 and one or more sub-arrays 210 of a memory bank 120 to perform a memory access operation. In some embodiments, the CPUs access the memory banks 120 through TSVs 155 that transport signals to and from the memory banks 120 of the DRAM layer 200. For instance, the TSVs 155 may provide signals to the memory banks 120 to perform a memory operation and receive data from the memory banks 120 in response to a read or write operation FIG. 3 depicts a block diagram of a sub-array 210 of a memory bank 120 as shown in FIG. 2. While FIG. 3 shows components related to a sub-array 210 of a memory bank 120, in some embodiments, a memory bank 120 may not be divided into sub-arrays 210 and operations may be performed on the memory bank 120 level. In an example, the sub-array 210 may include an array of memory cells arranged into 576 columns and 512 rows. In such an example, the length and width of the sub-array 210 may be approximately 20 µm, however, the sub-arrays 210 may also be larger or smaller.

The internal operations of the sub-array 210 may provide output signals at approximately 0.5V as shown in the figure. For example, during a read operation, a memory cell may be provided with selection signals of approximately 0.5V and may generate a differential signal representing the information stored on the memory cell. A sense amplifier may then generate a 0.5V differential signal responsive to sensing the signal on a bit line 305 associated with the memory cell. A column line 310 may then transport the bit from the sub-array 210 to an internal data link 315 that connects to TSVs that transport the data from the DRAM layer.

To transport a bit from the column line 310 to the TSVs, the DRAM layer may reduce the voltage swing of the bit to reduce the power consumption and heat generation of the internal data link 315. For example, as shown in FIG. 3, the voltage swing of a differential signal may be reduced to approximately 0.1V for transportation from the column line to TSVs. At the end of the column-to-TSV internal data link 315, the DRAM layer may increase the voltage to the 0.5V level in order to perform processing. For example, the DRAM layer may perform steering functions to properly direct the data. The data signal may then be reduced back to the lower voltage level to be transport on TSVs to a memory buffer.

Figure 4:
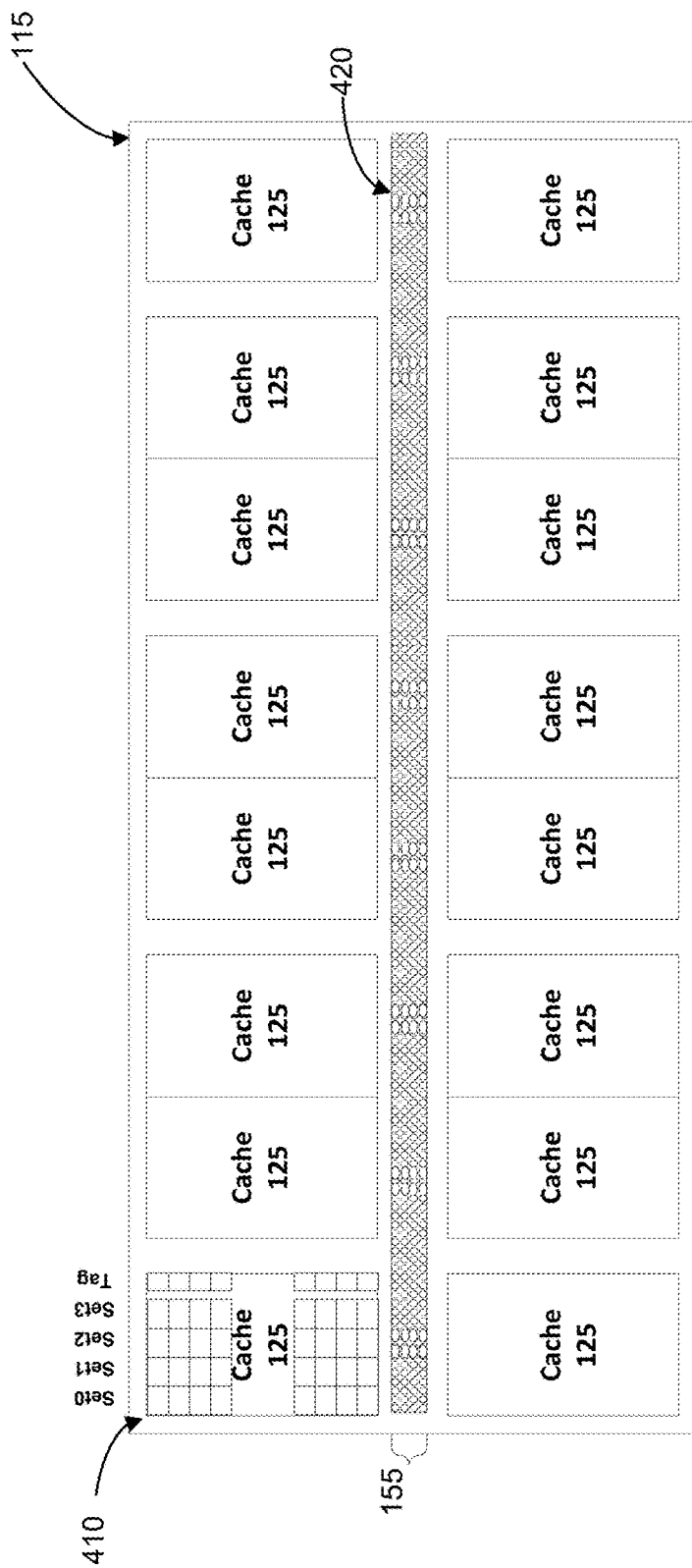
FIG. 4 is a block diagram of a memory buffer having a plurality of independent memory banks, according to an embodiment

FIG. 4 depicts a memory buffer 115 of a memory stack. For instance, the buffer 115 may be associated with a memory stack 110 as shown in FIG. 1. The buffer 115 may receive and transmit signals to and from DRAM layers of a memory stack. The memory buffer 115 may also receive and transmit signals to and from a CPU that provides requests for memory access. The memory buffer 115 may include a number of caches 125. Each cache 125 may include a number of static random access memory (SRAM) sub-arrays 410. In some embodiments, the caches 125 may be implemented with DRAM, or another type of memory, instead of SRAM. In an example, the memory buffer may include 16 caches and each of the caches may include 32 sub-arrays 410.

The memory buffer 115 may also include TSVs 155 that provide data links to layers of the associated memory stack. In addition, the memory buffer 115 may have a number of additional CPU data links 420 that provide access to the memory for one or more CPUs. In some embodiments, individual TSVs 155 and/or data links 420 to the CPUs may only provide access in one direction. For example, a CPU data link 420 may only receive signals from the CPUs and another CPU data link 420 may only transmit signals from the CPUs. In some other embodiments, individual TSVs 155 and CPU data links 420 may transmit and receive signals.

Figure 5:
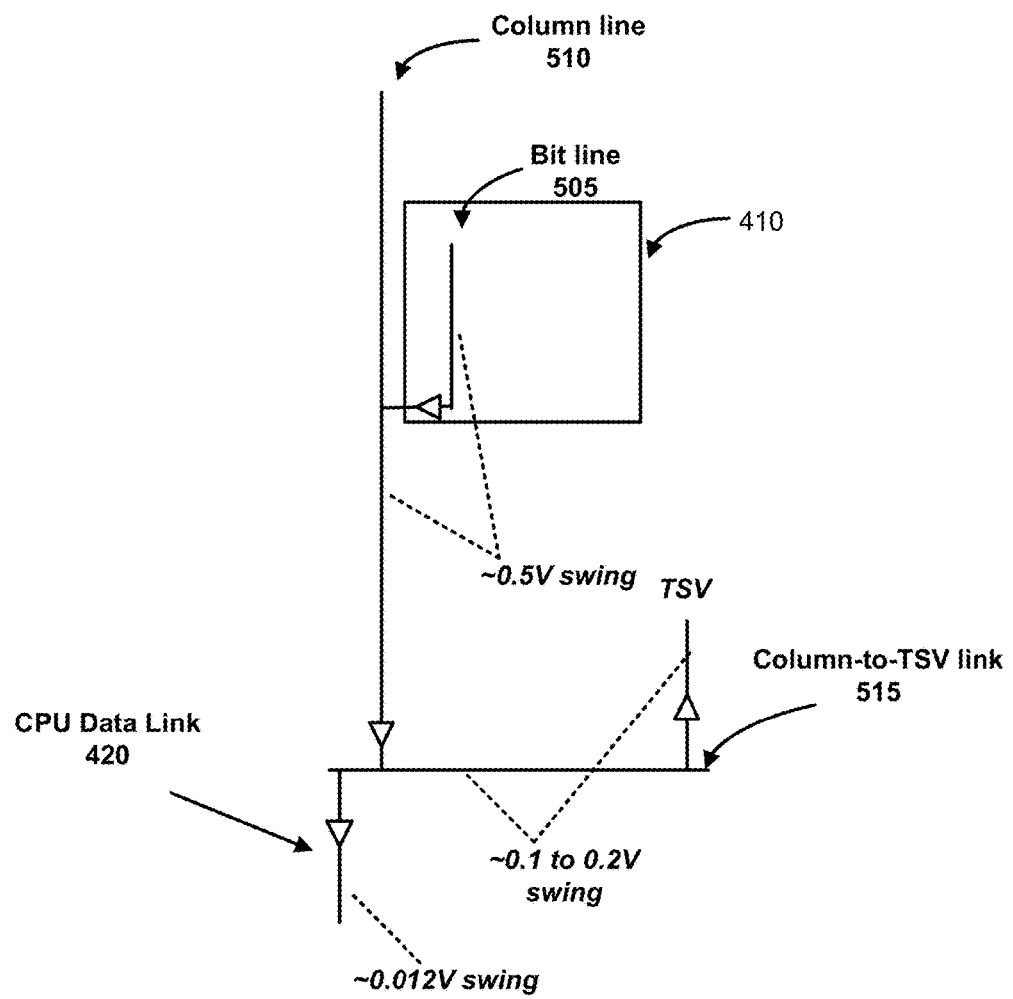
FIG. 5 is a block diagram depicting a memory buffer sub-array and associated data links, according to an embodiment.

FIG. 5 depicts a block diagram of a sub-array 410 of a memory cache 125 as shown in FIG. 4. The internal operations of the sub-array 410 may provide output signals at approximately 0.5V as shown in the figure. For example, information may be stored in the sub-array 410 and received from the sub-array 410 using 0.5V signals. The data received from a DRAM layer of an associated memory stack may be received through a TSV at a lower voltage. For example, as discussed above, the signal received through a TSV may be at approximately 0.1V. The signal may then be increased to 0.5V at the memory cache 125 to process and buffer the data.

When the data is retrieved from a memory cell in a sub-array 410, it may be transported on bit-line 505 and column line 510 at the higher voltage level. Then, to transport the data from the memory buffer, the signal may be reduced to the lower voltage level and provided through an internal data link to a CPU data link that transports data to CPUs. For example, an internal data link 515 may transport data from a column line 510 to a TSV associated with a CPU data link 420. The internal data link 515 may transport data at the lower voltage swing level as shown in FIG. 5. In some embodiments, the voltage may be modified to a lower value before transport to the CPUs, for example, as shown in the figures, after providing data to the data link, an interface may reduce the voltage to approximately a 0.012V swing.

In some embodiments, reducing the voltage swing to transport bits on data links may reduce the power consumed and the heat generated by approximately a factor of 25. For example, to transport a bit on a data link, the energy consumed may be approximated by the square of the voltage times the capacitance. Accordingly, reducing the transport voltage by a factor of 5 from 0.5V to 0.1V may generate a 25 times power savings. In an example, transporting a bit from a column line to TSVs at 0.5V may cost 0.05 pJ/bit. To transport the same bit at a 0.1V may cost only 0.002 pJ/bit. Similar energy savings may be realized at other data links such as TSV transport and TSV to CPU data link transport.

Figure 6:
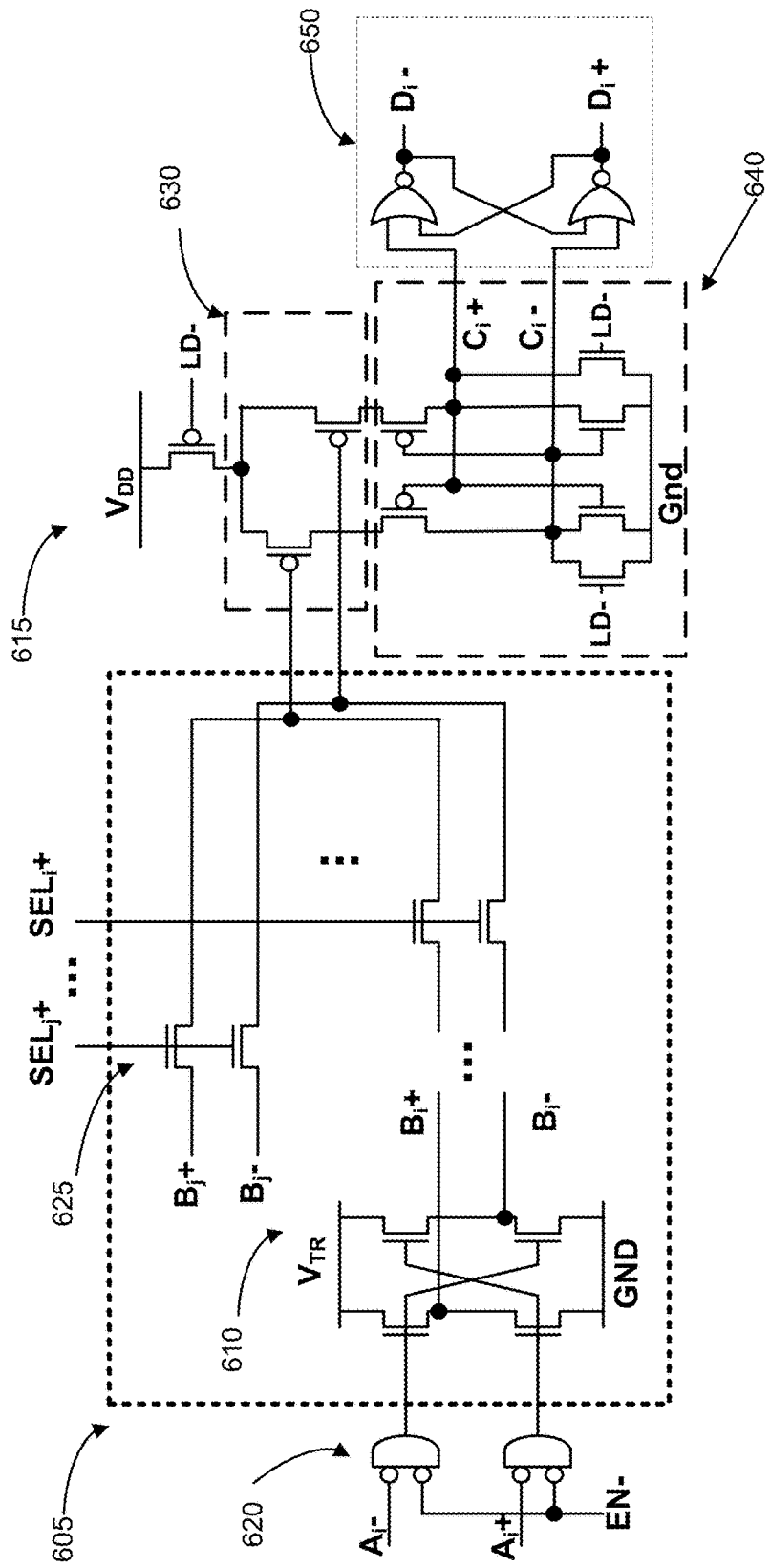
FIG. 6 is a block diagram depicting circuitry to perform voltage level shifting, according to an embodiment.

FIG. 6 depicts a block diagram of circuitry for transitioning from a high voltage domain to a lower voltage domain and back to a higher voltage domain in order to realize energy savings at data links. The circuitry may include voltage reduction circuitry 610 and voltage amplification circuitry 615. The area shown in box 605 indicates operation in the lower voltage domain. In the circuitry of FIG. 6, a differential signal ($A_i-$, $A_i+$) is provided in the higher voltage domain. For example, as discussed above, the signal may be provided at 0.5V. The signal may then be provided to logic gates 620 that selectively enables the signal to be transported at a lower voltage. For example, the EN-signal may provide an enable signal to a pair of logic gates 620 that provides the differential signal only when enabled. Accordingly, different sources may be enabled to use the same lower voltage transport wires at different times based on timing of enable signals to different sets of logic gates 620.

The logic gates 620 may then drive two sets of transistor stacks in the voltage reduction circuitry 610 to provide a lower voltage differential signal ($B_i-$, $B_i+$). The lower voltage signals may be set by a voltage $V_{TR}$ that is provided to the transistor stacks. For example, if the voltage $V_{TR}$ is provided at 0.1V, the differential signals in the lower voltage domain may be provided from the transistor stacks at 0.1V as well. In some embodiments, the voltage $V_{TR}$ may be provided from circuits external to the memory stacks. For example, in a lower temperature memory device, the voltage $V_{TR}$ may be generated externally and provided to the lower temperature domain to reduce the power consumption and heat generation within the lower temperature domain. In some embodiments, the voltage $V_{TR}$ may be generated within the memory device.

In addition, differential signals may be multiplexed using logic gates 625 in the low swing domain by selection signals. For example, in some embodiments, multiple data links in the lower voltage domain may each provide a differential signal that is to be increased to the higher voltage domain by the same voltage amplification circuitry 615. Accordingly, selection logic may provide only one of the differential signals to the voltage amplification circuitry 615 to level shift to a higher voltage at a time. For example, for two differential signals ($B_i-$, $B_i+$) and ($B_j-$, $B_j+$), a respective selection signal $SEL_i$ and $SEL_j$ may control logic gates 625 that provide one differential signal to the voltage amplification circuitry 615.

In some embodiments, logic gates 620 to control which differential signal is driven to the voltage reduction circuitry 610 may be used without multiplexing circuitry. For example, if there is only one set of wires provided to an associated voltage amplification circuitry 615, then there may be no reason to include multiplexing circuitry. Similarly, in some embodiments, the multiplexing circuitry may be used without logic gates 620. For example, if there are multiple wires in the lower voltage domain that each has associated voltage reduction circuitry 610 and a single source, the differential signals may be provided to the voltage reduction circuitry 610 without prior selection. In some embodiments, logic gates 620 and multiplexing circuits may be used together to achieve the advantages of each.

The differential signal provided in the low voltage domain may then be received at the voltage amplification circuitry 615. The voltage amplification circuitry 615 may be a level shifting latch that shifts the voltage level of received signals to a higher voltage domain. For example, if differential signals are received at a lower voltage domain, the level shifting latch in the voltage amplification circuitry 615 may increase the voltage to a higher voltage level. In some embodiments, the differential signals in the higher or lower voltage domain may be provided with a ground value at a low level or with a ground value at a midpoint. In some embodiments, the signals may be provided as single-ended signals either with ground at a low level with a generated midpoint reference or with the ground as a midpoint reference.

To level shift a received signal, the voltage amplification circuitry 615 may be pre-charged to the higher voltage levels. For example $V_{DD}$ may pre-charge the circuitry to 0.5V. The timing of the voltage circuitry may be performed by the LD– signal. In some embodiments, the LD– signal may be a clock signal, or phase of a clock signal, used by the memory device. In some embodiments, alternating phases of the clock signal may be coupled to voltage amplification circuits to pass through additional differential signals at a higher rate.

The differential signal may be received by pair of transistors 630 that are pre-charged to $V_{DD}$ based on the timing of the load signal (LD–). When the LD– signal provides a logical low signal, current is enable to flow based on the signals received at the transistors 630. The signal received at the transistors is then regeneratively amplified in cross-coupled latch 640 to amplify the signal to the higher voltage domain level (e.g., $V_{DD}$). The higher voltage domain signal ($C_i-$, $C_i+$) may then be provided to a holding latch 650 when the LD– signal returns to a logical high value. The holding latch 650 may then provide the differential signal ($D_i-$, $D_i+$) held in the latch 650 to higher voltage circuitry.

In some embodiments, different circuit configurations may be used to amplify differential signals from a low voltage domain to a high voltage domain. For example, rather than using the circuits shown, the differential signals may be provided directly into a differential amplifier. In some embodiments, the differential signals may also be amplified with a common gate NMOS pair rather than the PMOS devices described above. However, using a differential amplifier or NMOS pairs may require DC power to drive the circuits. The impact of using DC power to drive the circuits may be low if the circuits are operational most of the time, but may increase the overall power consumption if the voltage amplification circuit 615 has idle time.

Figure 7:
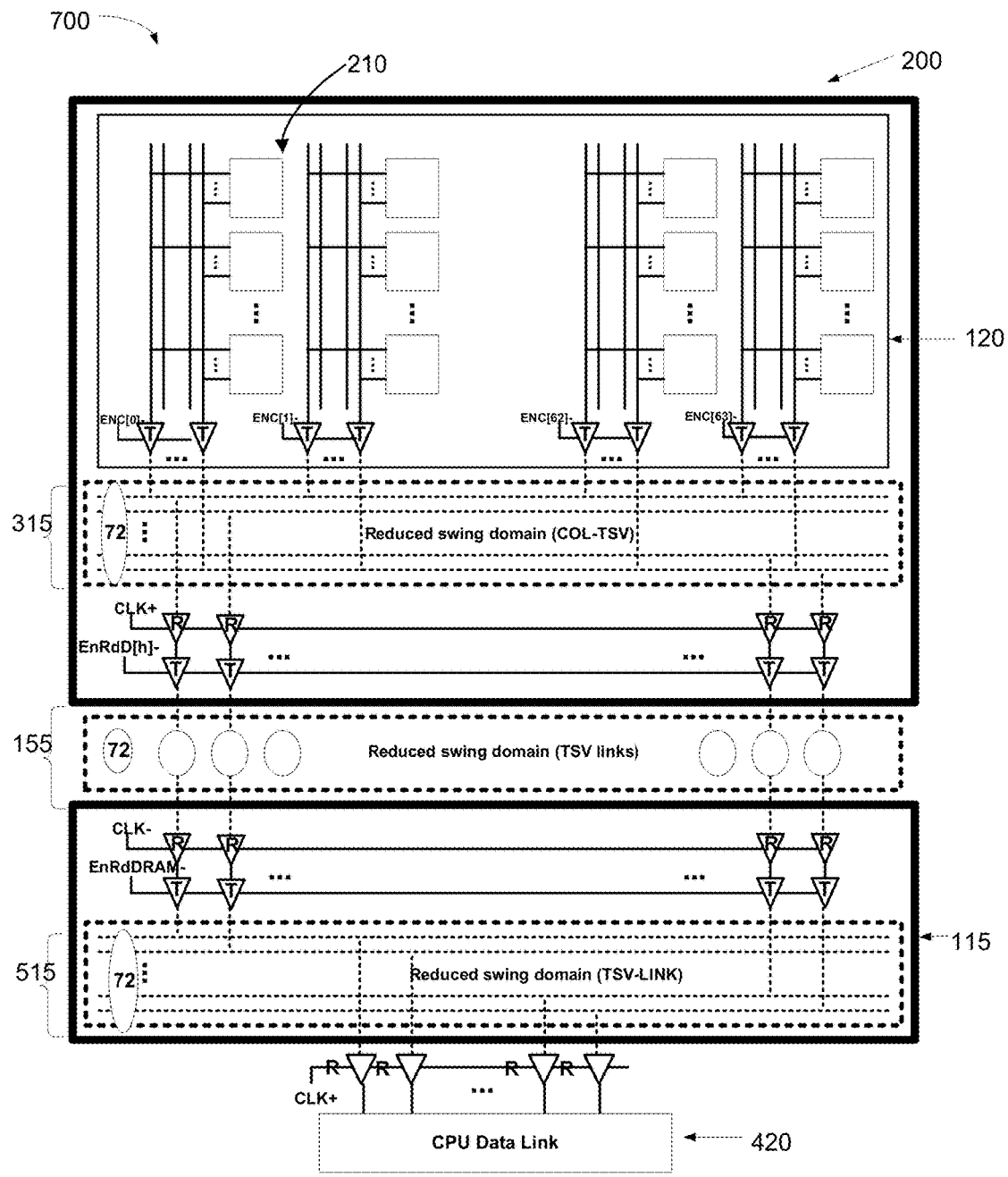
FIG. 7 is a block diagram depicting a memory stack, according to an embodiment.

FIG. 7 depicts a block diagram of a memory device 700 showing implementation of a lower voltage domain for data transport in a memory device. The block diagram depicts a path of data transport from a sub-array 210 to a link 420 that connects to an external device. The data stored at a sub-array 210 may be transported to a CPU data link 420 from a memory bank 120 through column-to-TSV internal data links 315, TSVs 155, and another set of column-to-TSV internal data links 515.

The memory device 700 also includes voltage reduction circuitry "T" and voltage amplification circuitry "R" to provide reduced voltage swing signal for data transport. In FIG. 7, the voltage reduction circuitry T is provided prior to column-to-TSV transport on an internal data link from a column line associated with a sub-array 210 to TSVs for transport from a memory bank 120. The voltage swing may then be increased by voltage amplification circuitry R in the DRAM layer 200. Then, prior to transport from the DRAM layer 200 to memory buffer 115, the voltage swing may be reduced again by voltage reduction circuitry T. The lower voltage swing data may then be transported from the DRAM layer 200 to a memory buffer 115 through TSV links 155. The memory buffer 115 may then increase the voltage swing with voltage amplification circuitry R in order to store and buffer the data. The memory buffer 115 may then reduce the voltage swing again with voltage reduction circuitry T prior to transporting the data across the memory buffer with column-to-TSV internal data links 515. Finally, prior to providing the data from the memory device 700, the data voltage swing may be increased by voltage amplification circuitry R and provided to CPU data link 420. The CPU data link 420 may the transport the data to an interface with a CPU such as interface 140 described with reference to FIG. 1.

Figure 8A:
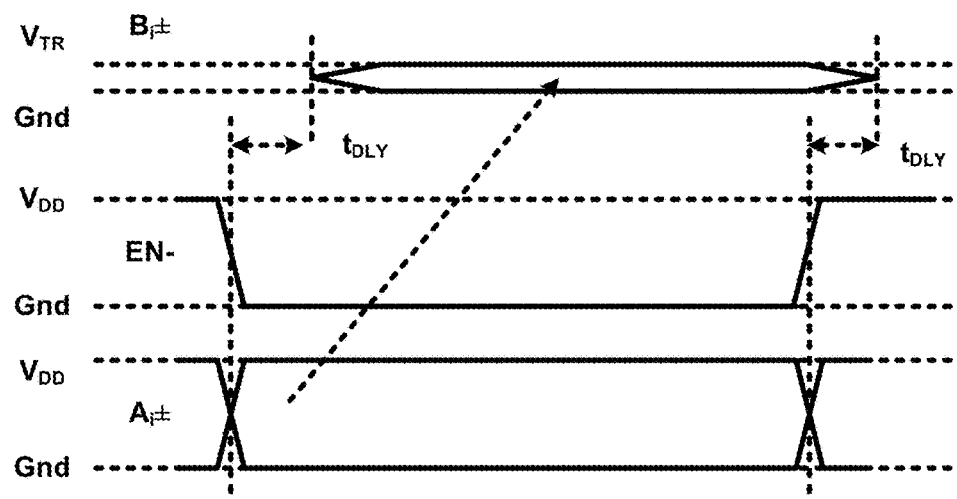
FIG. 8A is a timing diagram showing signals in a memory component to transmit over a data link, according to an embodiment.
Figure 8B:
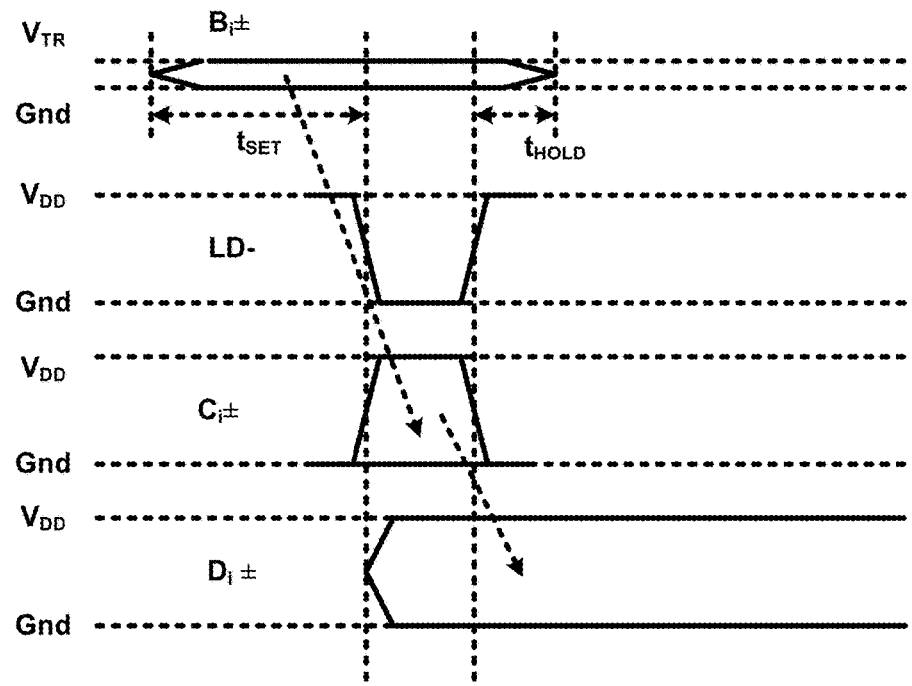
FIG. 8B is a timing diagram showing signals in a memory component as received over a data link, according to an embodiment.

FIGS. 8A and 8B depict timing diagrams showing transport signals in a memory device during operation, according to an embodiment. The figures are shown for circuitry to reduce and amplify voltage swings for signals representing data for transport across one or more data links of a memory device. FIG. 8A shows signals of voltage reduction circuitry prior to providing a signal to a data link. FIG. 8B shows signals of voltage amplification circuitry upon receiving a signal from a data link. For example, the signals A, B, C, D, and LD shown in FIGS. 8A and 8B may represent the signals shown in voltage reduction circuitry 610 and voltage amplification circuitry 615 as discussed with reference to FIG. 6 above.

In FIG. 8A, a differential signal $A_i\pm$ is received at voltage reduction circuitry. In some embodiments, the voltage level of the signal $A_i\pm$ may be approximately 0.5V. The signal may be provided to the circuitry in response to an enable signal EN−. As discussed with reference to FIG. 6, the enable signal may enable a pair of logic gates to drive the signal $A_i\pm$ to voltage reduction circuitry. The signal may then be reduced to a voltage swing $B_i\pm$ that is used to transport the data across a data link. In some embodiments, the voltage level of the signal $B_i\pm$ may be approximately 0.1V. Reducing the voltage swing of the signal may cause a delay ($t_{DLY}$) before the transport of the data across the data link due to the operation of circuits used to reduce the voltage. The reduced voltage differential signal $B_i\pm$ may then be transported across a data link.

In FIG. 8B, the differential signal $B_i\pm$ is received at voltage amplification circuitry. As discussed above, the voltage level of $B_i\pm$ may be approximately 0.1V, in some embodiments. In response to a load signal (LD−), the differential signal $B_i\pm$ may be amplified to a higher voltage differential signal $C_i\pm$. The voltage level of $C_i\pm$ may be approximately 0.5V, or the same voltage as the differential signal $A_i\pm$. In some embodiments, the load signal LD− may be one phase of an internal clock signal of a memory device. The signal $C_i\pm$ may then be held by a latch as a differential signal $D_i\pm$. The differential signal $D_i\pm$ may then be provided for use by internal circuits of the memory device. Amplifying the voltage swing to a higher level may cause a delay of $t_{SET}$ and $t_{Hold}$ for the time spent setting the voltage of a pair of transistors and the time spent setting a latch to hold the amplified voltage. The timing diagrams shown in FIGS. 8A and 8B may be representative of the signals generated before and after transport across any of the data links discussed above. For example, the signals may be generated by voltage reduction circuitry and voltage amplification circuitry before and after data transport across column-to-TSV internal data links 315, before and after data transport across TSVs 155, or before and after data transport across column-to-TSV internal data links 515.

Figure 9:
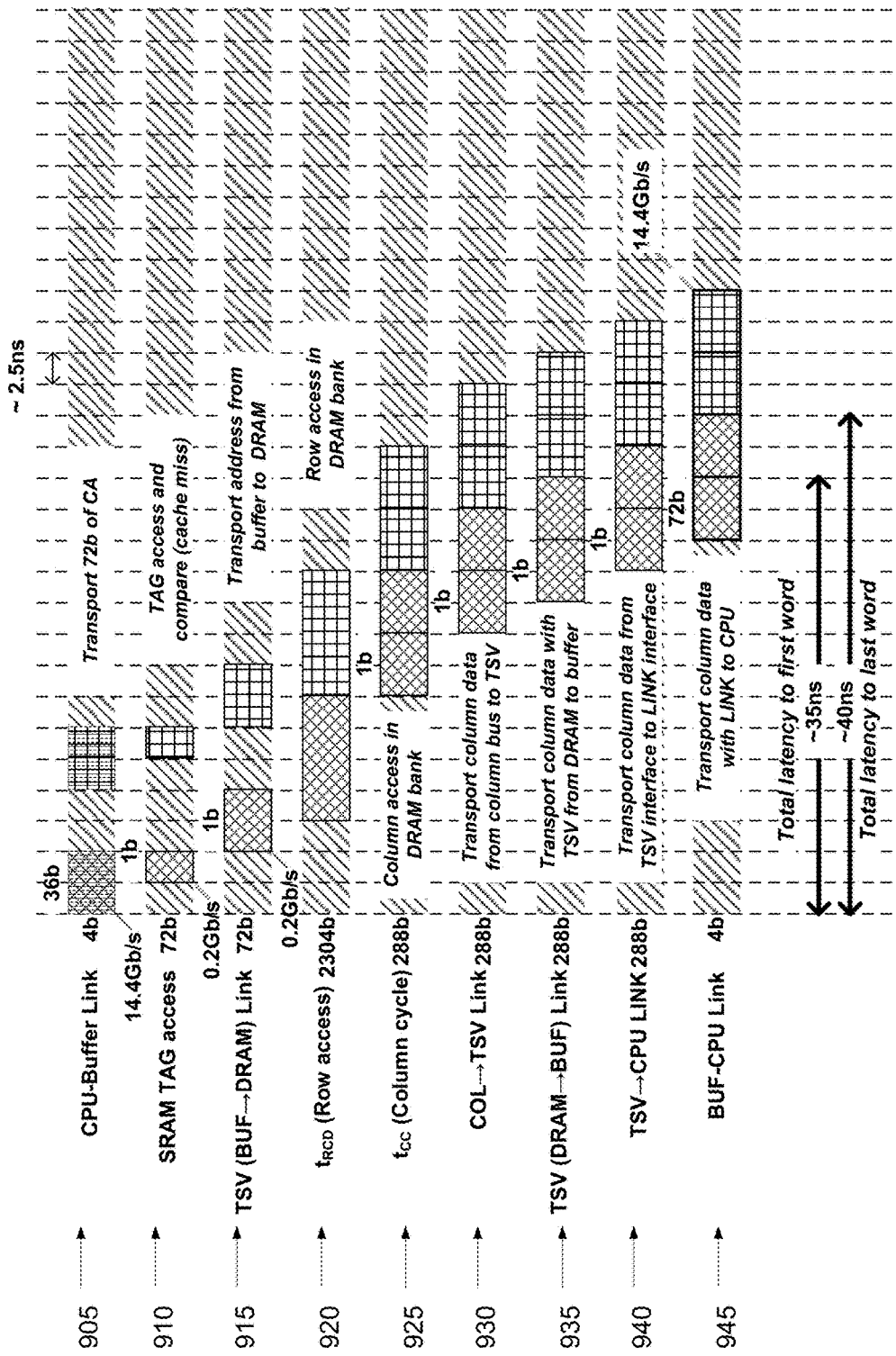
FIG. 9 is a timing diagram showing signals in a memory component during a read operation, according to an embodiment.

The timing of data transport to and from a memory cell for a read operation is shown in FIG. 9. Beginning at the top of the timing diagram at operation 905, a CPU provides a memory access command to a memory buffer. The memory buffer may then perform internal processing in operations 910 to determine how to perform the memory access. At operation 915, the memory buffer may send a command over TSVs to a DRAM layer of a memory stack associated with the memory buffer. In operations 920 and 925, the DRAM layer may perform row access and column cycle operations to read data from memory cells in a sub-array of the DRAM layer.

To transport the data read from the memory cells, the DRAM layer may reduce the voltage swing of the data and provide the data across the DRAM array to TSVs through an internal data link in operation 930. The time taken for the transport may include an additional delay to reduce the voltage swing of the data prior to transport and amplify the voltage swing upon receiving it at the other end of a data link. Similarly, prior to provide the data from the DRAM layer to the memory buffer in operations 935, the voltage swing may again be reduced. The memory buffer may then amplify the received signal. This may cause an additional delay in the transport of data. Finally, the data may be transported from the memory buffer to a CPU link through an internal data link in operations 940. The voltage swing of the data may again be reduced prior to transport over the data link and increase after receiving the data from the data link causing a delay in the transport of data. In operations 945, the memory buffer may then provide the data read from the memory cells to the CPU over a link from the memory to the CPU.

In an example, the delay in transport to provide the data from memory cells to the CPU link may be approximately 7.5 ns as shown in FIG. 9. In some embodiments, the delay may be shorter or longer depending on the implementation. The resulting latency from receiving a memory access request from a CPU to providing the first data back to the CPU may be approximately 35 ns and the latency to the last data for the memory access request may be approximately 40 ns. In some embodiments, fewer or additional data links may use a reduced swing voltage for data transport. For example, TSV links from the memory buffer to a DRAM layer may be provided at a reduced swing voltage.

In some embodiments, while level shifting the voltage of signals within a memory stack may increase latency of data transport, the latency for memory access may be reduced by reducing serialization of links from CPUs to memory stacks. For example, links from CPUs to the memory devices may be performed with four bits in parallel instead of a single bit at a time in a serial link. The parallel links may be provided to a single memory buffer for four memory stacks instead of to a memory buffer for each memory stack. This may increase the distance for transport across a memory buffer to and from a TSV to transport data to a particular DRAM layer. For example, the maximum distance to transport data may be doubled. The increased distance may cause a larger amount of power consumption for data transport. However, the data link across the memory buffer may be performed at the lower voltage level. This may reduce the power consumption and heat generated. Accordingly, the energy savings for lower level voltage swing data transport may enable reduced serialization and therefore reduced latency for memory access. In some embodiments, other configurations of data transport to and from one or more CPUs may be implemented.

In the above description, numerous details are set forth. It will be apparent, however, to one of ordinary skill in the art having the benefit of this disclosure, that some embodiments may be practiced without these specific details. In some instances, well-known structures and devices are shown in block diagram form, rather than in detail, in order to avoid obscuring the description.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "transmitting," "receiving," "storing," "providing," "sensing," "transporting," "producing," or the like, refer to the actions and processes of a computing system, or similar electronic computing device, that manipulates and transforms data represented as physical (e.g., electronic) quantities within the computing system's registers and memories into other data similarly represented as physical quantities within the computing system memories or registers or other such information storage, transmission or display devices.

The words "example" or "exemplary" are used herein to mean serving as an example, instance or illustration. Any aspect or design described herein as "example" or "exemplary" is not necessarily to be construed as preferred or advantageous over other aspects or designs. Rather, use of the words "example" or "exemplary" is intended to present concepts in a concrete fashion. As used in this disclosure, the term "or" is intended to mean an inclusive "or" rather than an exclusive "or." That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this disclosure and the appended claims should generally be construed to mean "one or more" unless specified otherwise or clear from context to be directed to a singular form. Moreover, use of the term "an embodiment" or "one embodiment" or "an implementation" or "one implementation" throughout is not intended to mean the same embodiment or implementation unless described as such.

The above description sets forth numerous specific details such as examples of specific systems, components, methods and so forth, in order to provide a good understanding of several embodiments. It will be apparent to one skilled in the art, however, that at least some embodiments may be practiced without these specific details. In other instances, well-known components or methods are not described in detail or are presented in simple block diagram format in order to avoid unnecessarily obscuring embodiments of the disclosure. Thus, the specific details set forth above are merely exemplary. Particular implementations may vary from these exemplary details and still be contemplated to be within the scope of the disclosure.

The description above includes specific terminology and drawing symbols to provide a thorough understanding of the disclosure. In some instances, the terminology and symbols may imply specific details that may not be required. For example, any of the specific numbers of bits, signal path widths, signaling or operating frequencies, component circuits or devices and the like may be different from those described above in alternative embodiments. Also, the interconnection between circuit elements or circuit blocks shown or described as multi-conductor signal links may alternatively be single-conductor signal links, and single conductor signal links may alternatively be multiconductor signal links. Signals and signaling paths shown or described as being single-ended may also be differential, and vice-versa. Similarly, signals described or depicted as having active-high or active-low logic levels may have opposite logic levels in alternative embodiments. Component circuitry within integrated circuit devices may be implemented using metal oxide semiconductor (MOS) technology, bipolar technology or any other technology in which logical and analog circuits may be implemented. With respect to terminology, a signal is said to be "asserted" when the signal is driven to a low or high logic state (or charged to a high logic state or discharged to a low logic state) to indicate a particular condition. Conversely, a signal is said to be "de-asserted" to indicate that the signal is driven (or charged or discharged) to a state other than the asserted state (including a high or low logic state, or the floating state that may occur when the signal driving circuit is transitioned to a high impedance condition, such as an open drain or open collector condition). A signal driving circuit is said to "output" a signal to a signal receiving circuit when the signal driving circuit asserts (or de-asserts, if explicitly stated or indicated by context) the signal on a signal line coupled between the signal driving and signal receiving circuits. A signal line is said to be "activated" when a signal is asserted on the signal line, and "deactivated" when the signal is de-asserted. Additionally, the prefix symbol "/" attached to signal names indicates that the signal is an active low signal (i.e., the asserted state is a logic low state). A line over a signal name (e.g., '<signalname>') is also used to indicate an active low signal. The term "coupled" is used herein to express a direct connection as well as a connection through one or more intervening circuits or structures. Integrated circuit device "programming" may include, for example and without limitation, loading a control value into a register or other storage circuit within the device in response to a host instruction and thus controlling an operational aspect of the device, establishing a device configuration or controlling an operational aspect of the device through a one-time programming operation (e.g., blowing fuses within a configuration circuit during device production), and/or connecting one or more selected pins or other contact structures of the device to reference voltage lines (also referred to as strapping) to establish a particular device configuration or operation aspect of the device. The term "exemplary" is used to express an example, not a preference or requirement. While the disclosure describes specific embodiments, it will be evident that various modifications and changes may be made thereto. For example, features or aspects of any of the embodiments may be applied, at least where practicable, in combination with any other of the embodiments or in place of counterpart features or aspects thereof. Accordingly, the specification and drawings are to be regarded in an illustrative rather than a restrictive sense.

It is to be understood that the above description is intended to be illustrative and not restrictive. Many other embodiments will be apparent to those of skill in the art upon reading and understanding the above description. The scope of the disclosure should, therefore, be determined with reference to the appended claims, along with the full scope of equivalents to which such claims are entitled.

What is claimed is:

1. A memory stack comprising:
   at least two memory components each having a first data link interface coupled to a data link, wherein each of the at least two memory components is to operate at a first voltage level and transmit signals via the first data link interface using a second voltage level, wherein the second voltage level is lower than the first voltage level;
   a buffer component having a second data link interface coupled to the data link; and
   voltage reduction circuitry to reduce the first voltage level of the signals to the second voltage level before transmitted via the first data link interface.

2. The memory stack of claim 1, wherein the buffer component is to operate at the first voltage level and transmit signals via the second data link interface using the second voltage, wherein the memory stack further comprises second voltage reduction circuitry to reduce signals from the buffer component at the first voltage level to the second voltage level.

3. The memory stack of claim 1, wherein the data link comprises a through-silicon-via (TSV).

4. The memory stack of claim 1, wherein each of the at least two memory components uses the first voltage level for internal signaling on an internal data link.

5. The memory stack of claim 2, wherein the buffer component uses the first voltage level for internal signaling on an internal data link.

6. The memory stack of claim 1, wherein each of at least two memory components is to transmit the signals as differential signals.

7. The memory stack of claim 1, wherein the at least two memory components and the buffer component operate at a temperature of less than 80 Kelvin.

8. The memory stack of claim 1, wherein the signals are differential signals, and wherein the voltage reduction comprises:
   a pair of logic gates controlled by an enable signal, the pair of logic gates to receive a higher voltage differential signal; and
   two sets of transistor stacks, wherein the pair of logic gates drive the two sets of transistor stacks to provide a lower voltage differential signal when enabled by the enable signal.

9. A memory stack comprising:
   a memory cell;
   a first internal data link;
   a voltage reduction circuit coupled to the memory cell and the first internal data link, wherein the voltage reduction circuit is to reduce a first voltage level of a signal received from the memory cell to a second voltage level before the signal is transmitted over the first internal data link;
   a voltage amplification circuit coupled to the internal data link, wherein the voltage amplification circuit is to increase the second voltage level of the signal received from the first internal data link to the first voltage level before the signal is processed by a control circuit; and
   the control circuit coupled to the voltage amplification circuit, the control circuit to process the signal received from the amplification circuit.

10. The memory stack of claim 9, further comprising:
    a second internal data link; and
    a second voltage reduction circuit coupled to the control circuit and the second internal data link, wherein the second voltage reduction circuit is to reduce the first voltage level of the signal processed by the control circuit to the second voltage level before the signal is transmitted over the second internal data link.

11. The memory stack of claim 10, further comprising:
    a second voltage amplification circuit coupled to the second internal data link, wherein the second voltage amplification circuit is to increase the second voltage level of the signal received from the second internal data link to the first voltage level before the signal is processed by a memory buffer; and
    the memory buffer coupled to the second voltage amplification circuit, the memory buffer to process the signal received form the second voltage amplification circuit.

12. The memory stack of claim 11, further comprising:
    a first layer comprising the memory cell, the first internal data link, the voltage reduction circuit, the voltage amplification circuit, and the control circuit; and
    a second layer comprising the second voltage amplification circuit and the memory buffer, wherein the second internal data link comprises a through-silicon-via (TSV).

13. The memory stack of claim 9, wherein the memory cell, the first internal data link, the voltage reduction circuit, the voltage amplification circuit, and the control circuit operate at a temperature of less than 80 Kelvin.

14. The memory stack of claim 9, wherein the signal received from the memory cell is a differential signal, wherein the voltage reduction circuit comprises:
    a pair of logic gates controlled by an enable signal, the pair of logic gates to receive a higher voltage differential signal; and
    two sets of transistor stacks, wherein the pair of logic gates drive the two sets of transistor stacks to provide a lower voltage differential signal when enabled by the enable signal.

15. The memory stack of claim 9, further comprising:
    a second internal data link; and
    selection logic coupled to the first internal data link, the second internal data link, and the voltage amplification circuit, wherein the selection logic is to:
    receive a selection signal;
    receive the signal at the second voltage level from the first internal data link;
    receive a second signal at the second voltage level from the second internal data link; and
    select the signal or the second signal to be provided to the voltage amplification circuit based on the selection signal.

16. A circuit for transitioning between a high voltage domain and a lower voltage domain in a memory stack, the circuit comprising:
    a voltage reduction circuit coupled to a memory cell and a first internal data link, wherein the voltage reduction circuit is to reduce a first voltage level of a first differential signal received from the memory cell to a second differential signal at a second voltage level before the second differential signal is transmitted over the first internal data link; and
    a voltage amplification circuit coupled to the internal data link and a processing component, wherein the voltage amplification circuit is to increase the second voltage level of the second differential signal received from the first internal data link to a third differential signal at the first voltage level before the third differential signal is processed by the processing component.

17. The circuit of claim 16, wherein the voltage reduction circuit comprises:

a pair of logic gates controlled by an enable signal, the pair of logic gates to receive the first differential signal from the memory cell; and two sets of transistor stacks, wherein the pair of logic gates drive the two sets of transistor stacks to provide the second differential signal on the first internal data link when enabled by the enable signal.

18. The circuit of claim 16, wherein the voltage amplification circuit comprises:

a pair of differential transistors to amplify the second differential signal received form the first internal data link to obtain the third differential signal at the first voltage level.

19. The circuit of claim 16, wherein the voltage amplification circuit comprises:

a pair of differential transistors to amplify the second differential signal received form the first internal data link to obtain the third differential signal at the first voltage level; and a holding latch coupled the pair of differential transistors to hold the third differential signal.

20. The circuit of claim 16, further comprising selection logic coupled to a second internal data link, the first internal data link, and the voltage amplification circuit, wherein the selection logic is to:

receive a selection signal;

receive the second differential signal at the second voltage level from the first internal data link;

receive a fourth differential signal at the second voltage level from the second internal data link; and select the second differential signal or the fourth differential signal to be provided to the voltage amplification circuit based on the selection signal.

\* \* \* \* \*

UNITED STATES PATENT AND TRADEMARK OFFICE
CERTIFICATE OF CORRECTION

PATENT NO. : 10,199,089 B2
APPLICATION NO. : 15/876539
DATED : February 5, 2019
INVENTOR(S) : Frederick A. Ware, John Eric Linstadt and Thomas Vogelsang Page 1 of 1

It is certified that error appears in the above-identified patent and that said Letters Patent is hereby corrected as shown below:

In the Claims

In Claim 18, Column 15, Line 11, delete "form" and insert --from--

In Claim 19, Column 15, Line 17, delete "form" and insert --from--

Signed and Sealed this
Thirteenth Day of August, 2019

Andrei Iancu
*Director of the United States Patent and Trademark Office*